(12) United States Patent
Serizawa

(10) Patent No.: US 6,452,311 B1
(45) Date of Patent: Sep. 17, 2002

(54) PIEZOELECTRIC DEVICE, MANUFACTURING METHOD THEREFOR, AND METHOD FOR MANUFACTURING PIEZOELECTRIC OSCILLATOR

(75) Inventor: Satoshi Serizawa, Sagamihara (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/933,154

(22) Filed: Aug. 21, 2001

(30) Foreign Application Priority Data

Aug. 31, 2000 (JP) ........................................ 2000-263557

(51) Int. Cl.$^7$ ........................................... H01L 41/047
(52) U.S. Cl. ...................... 310/363; 310/364; 310/348; 29/25.35
(58) Field of Search ................................ 310/348, 363, 310/364; 29/25.35

(56) References Cited

U.S. PATENT DOCUMENTS

| | | | | |
|---|---|---|---|---|
| 4,259,607 A | * | 3/1981 | Noguchi et al. | ............ 310/364 |
| 4,546,283 A | * | 10/1985 | Adamo et al. | .......... 310/313 R |
| 5,406,682 A | * | 4/1995 | Zimnicki et al. | .......... 29/25.35 |
| 5,828,159 A | * | 10/1998 | Miyagawa et al. | ......... 310/312 |
| 5,991,989 A | * | 11/1999 | Onishi et al. | ............... 29/25.35 |
| 6,088,893 A | * | 7/2000 | Takeuchi et al. | ........... 29/25.35 |
| 6,105,225 A | * | 8/2000 | Torii et al. | ................ 250/338.3 |
| 2002/0024271 A1 | * | 6/2001 | Hori et al. | ................... 310/364 |

FOREIGN PATENT DOCUMENTS

JP 6-132754 * 5/1994 ............ H03H/3/02

* cited by examiner

Primary Examiner—Thomas M. Dougherty
(74) Attorney, Agent, or Firm—Oliff & Berridge, PLC

(57) ABSTRACT

The invention provides a piezoelectric device having a structure which resists impact from the exterior and which can enhance electrical conductance between an electrode side of a package base and a piezoelectric resonator element. A piezoelectric device having a structure in which a piezoelectric resonator element is bonded to electrodes provided on a package base, includes underlying exposed electrodes as mounting electrodes which are provided on the package base and on which the piezoelectric resonator element is mounted; and gold-plated electrodes which are provided on the package base and to which a driving voltage is carried via conduction paths; in which the underlying exposed electrodes and the gold-plated electrodes are connected to each other with conductive adhesives provided therebetween, and the piezoelectric resonator element is bonded to the underlying exposed electrodes with silicone-based conductive adhesives provided therebetween.

6 Claims, 13 Drawing Sheets

PIEZOELECTRIC DEVICE, MANUFACTURING METHOD THEREFOR, AND METHOD FOR MANUFACTURING PIEZOELECTRIC OSCILLATOR

BACKGROUND OF THE INVENTION

1. Field of Invention

The present invention relates to structures of piezoelectric devices, such as piezoelectric resonators or piezoelectric oscillators, having a piezoelectric resonator element accommodated in a package, and to manufacturing methods therefor.

2. Description of Related Art

FIGS. 8(a) and 8(b) show an example of a conventional piezoelectric resonator, and for the convenience of understanding, a lid body thereof is omitted in the figures. FIG. 8(a) is a plan view showing the interior of the piezoelectric resonator by removing the lid body, and FIG. 8(b) is a schematic cross-sectional view showing the interior taken along plane A–A (shown in FIG. 8(a)) by removing the lid body.

In FIGS. 8(a) and 8(b), a piezoelectric resonator 10 has a package base 12 in the form of a box in which a space portion 13 is formed for accommodating a piezoelectric resonator element 11 in the form of a plate. One end 11a of the piezoelectric resonator element 11 is fixed on gold-plated electrodes 14 and 14, which are two mounting electrodes disposed on a step 19 formed in the space portion 13, by bonding using silicone-based conductive adhesives 15 and 15, and the other end 11b is a free end.

In this structure, the piezoelectric resonator element 11 is formed of, for example, quartz crystal, and on the surface thereof, electrodes (not shown) are formed which apply a driving voltage to the quart crystal for performing a predetermined oscillation. As a material for the lid body, which is not shown, for sealing the package base 12, a metal, such as Koval, or a ceramic, such as alumina, is used.

As a material for the package base 12, a ceramic, such as alumina, is used, and in the case shown in FIG. 8(b), on a first base material 16 in the form of a flat plate, a second base material 17, having an opening formed therein, is placed, and in addition, a third base material 18, having an opening formed therein, which is larger than the opening in the second base material, is placed thereon. Furthermore, on the third base material 18, a seam ring 18a is disposed. Accordingly, the package base 12 has the space portion 13 formed therein, so that the piezoelectric resonator element 11 can be accommodated, and in addition, the step 19 is formed for bonding the piezoelectric resonator element 11 thereto.

The mounting electrodes 14 and 14 on the surface of the step 19 are connected to external terminals 14a, which are exposed outside the package base 12 via conduction paths 14b passing through the layered structure formed of the laminated base materials.

Accordingly, a driving voltage from the external terminals 14a is applied to electrodes, which are formed on the surface of the piezoelectric resonator element 11 via the mounting electrodes 14 and 14, and the piezoelectric resonator element 11 oscillates at a predetermined frequency.

FIG. 9 is a flow chart generally showing steps of manufacturing the piezoelectric resonator 10 described above.

In FIG. 9, first, the package base 12 is formed using a ceramic material, such as alumina, and the mounting electrodes 14 and 14 are formed by, for example, plating so as to correspond to the piezoelectric resonator element 11.

In this step, in order for the package base 12 to be formed as a laminated structure as described above, green sheets, formed of ceramic materials corresponding to individual layers, are formed for each layer, and are then laminated to each other, and firing is then performed.

For example, FIG. 10 shows a green sheet including the second base material layers 17 shown in FIG. 8, and shows a state in which a plurality of the second layer base materials 17 are formed in one green sheet which is not yet cut. On the second base material layer 17, for example, as shown in FIG. 10, the mounting electrode 14, which is connected to the conduction path 14b, is formed by electroplating or a similar method. That is, after the individual layers are laminated to each other and are then fired, the seam ring 18a (shown in FIGS. 11(a) and 11(b)) is brazed thereto, and gold electroplating is performed on the external terminal 14a. In this step, as described above, since the mounting electrode 14 is connected to the external terminal 14a via the conduction path 14b, the mounting electrode 14 and the conduction path 14b are formed by gold (Au) plating on a tungsten metalized underlying layer at exposed areas thereof which have been laminated.

FIGS. 11(a) and 11(b) show the package base 12 formed of the individual base materials laminated to each other. FIG. 11(a) is a plan view of the package base 12, and FIG. 11(b) is a schematic cross-sectional view taken along plane B—B (shown in FIG. 11(a)).

As shown in FIGS. 11(a) and 11(b), when the third base martial 18 is placed on the second base material 17, the conduction path 14b is located below the third base material 18 and is almost covered therewith, and the two mounting electrodes 14 and 14 are exposed on the step 19.

Next, after the seam ring is brazed to the third base material 18, gold plating is performed on the exposed mounting electrodes 14 and 14 described above.

Accordingly, only the mounting electrodes 14 and 14, which are exposed, are plated with gold, and the conduction path passing through the layers is not plated with gold.

On the other hand, in FIG. 9, an excitation electrode and a connection electrode are formed by deposition on the piezoelectric resonator element 11, and silicone-based conductive adhesives 15 and 15 are applied to the mounting electrodes 14 and 14 on which the piezoelectric resonator element 11 is to be mounted (ST1).

Next, on the mounting electrodes 14 and 14 of the package base 12 in FIG. 8, the piezoelectric resonator element 11 described above is fixed by bonding using the silicone-based conductive adhesives 15 and 15, as shown in FIG. 8 (ST2).

Next, the package base 12 is placed in a heat curing oven, which is not shown, and the silicone-based conductive adhesives 15 and 15 are dried and cured (ST3). Subsequently, when the piezoelectric resonator element 11 is sufficiently fixed on the mounting electrodes 14 and 14 with the silicone-based conductive adhesives 15 and 15 provided therebetween, a driving voltage from the external terminals 14a is applied to the piezoelectric resonator element 11 via the conduction paths 14b and the mounting electrodes 14 and 14, and while the oscillation frequency is monitored, the weights of the electrodes are reduced by, for example, irradiating laser light on the surface of the piezoelectric resonator element 11, whereby frequency adjustment is performed (ST4).

Next, the lid body, which is not shown, is placed on the package base 12, and sealing is performed by, for example, seal welding (ST5).

As described above, the piezoelectric resonator 10 is complete.

Most of the steps described above are commonly used for a piezoelectric oscillator which is another piezoelectric device. That is, unlike the piezoelectric resonator, since the piezoelectric oscillator has an integrated circuit mounted in the package base, accordingly, the structure and the steps thereof are slightly different from those of the piezoelectric resonator.

FIGS. 12(a) and 12(b) show an example of a conventional piezoelectric oscillator, and for the convenience of understanding, a lid body thereof is omitted in FIGS. 12(a) and 12(b). FIG. 12(a) is a plan view showing the interior of the piezoelectric oscillator by removing the lid body, and FIG. 12(b) is a schematic cross-sectional view showing the interior taken along plane C—C (shown in FIG. 12(a)) by removing the lid body.

In the figures described above, the same reference numerals of the piezoelectric resonator in FIG. 10 designate constituents equivalent thereto, descriptions thereof are omitted, and the different points therefrom are mainly described.

A piezoelectric oscillator 20 has a package base 22 in the form of a box in which a space portion 23 is formed for accommodating a piezoelectric resonator element 11 in the form of a plate. One end 11a of the piezoelectric resonator element 11 is fixed on gold-plated electrodes 14 and 14, which are two mounting electrodes disposed on a step 19 formed in the space portion 23, by bonding using silicone-based conductive adhesives 15 and 15 provided therebetween, and the other end 11b is a free end.

The package base 22 is formed by laminating four base materials 26, 27, 28, and 29 with each other, which are formed of a ceramic, the base material 26 located at the bottom is in the form of a flat plate, and the base materials 27, 28, and 29 placed thereon are formed of ring-shaped or frame-shaped materials having the inside diameters which are increased in this order. Accordingly, the space portion 23 is formed inside the package base 22 so that the piezoelectric resonator element 11 is accommodated therein, and in addition to the step 19 for bonding the piezoelectric resonator element 11 thereon, a second step 31 is formed at an even lower place.

The mounting electrodes 14 and 14 on the step 19 are connected to an integrated circuit 21 via conduction paths 14b passing through the laminated structure formed of the laminated base materials.

In addition, on the bottom inside the package base 22, the integrated circuit 21 is mounted, and on the step 31, a plurality of electrodes 24, which are to be wire-bonded to this integrated circuit 21 by gold wires 25, is formed. Since some of the electrodes 24 and the mounting electrodes 14 and 14 are connected to each other via the conduction paths 14b, the mounting electrodes 14 and 14 will also be plated with gold.

FIGS. 13(a) and 13(b) show the arrangement of the individual electrodes by showing the package base 22 formed of the laminated base materials. FIG. 13(a) is a plan view of the package base 22, and FIG. 13(b) is a schematic cross-sectional view taken along plane D—D (shown in FIG. 13(a)).

As shown in FIGS. 13(a) and 13(b), on the step 19, the mounting electrodes 14 and 14 are formed, and on the step 31, the plurality of electrodes 24, which are to be wire-bonded, are formed. In addition, on the inside bottom surface, an electrode 32 for mounting the integrated circuit 21 is provided. Methods for forming these electrodes are equivalent to those described for the piezoelectric resonator 10.

Consequently, in the piezoelectric oscillator 20, when a driving voltage applied from the integrated circuit 21 is applied to the electrodes formed on the surface of the piezoelectric resonator element 11 via the mounting electrodes 14 and 14, the piezoelectric resonator element 11 oscillates at a predetermined frequency, and the output signal thereof is inputted to the integrated circuit 21, whereby an external signal having a predetermined frequency can be obtained.

In this connection, the conventional piezoelectric device has the problem described below.

Since this problem is a basically common problem for the piezoelectric resonator 10 and the piezoelectric oscillator 20, the problem relating to the piezoelectric resonator 10 will be described.

As described in FIGS. 8(a), 8(b), 10, 11(a) and 11(b), in the conventional piezoelectric resonator 10, the mounting electrodes 14 and 14 are connected to the external terminals 14a (the electrodes 24 to be wire-bonded in the piezoelectric oscillator 20) via the conduction paths 14b.

It is advantageous that the external terminals 14a and the electrodes 24 be gold plated, as in the structure described above, in order to ensure solder wettability and in view of bonding characteristics or oxidation resistance, and the mounting electrodes 14 and 14 connected thereto are simultaneously gold plated.

In addition, the electrodes of the piezoelectric resonator element 11 are bonded to the mounting electrodes 14 and 14 using the silicone-based conductive adhesives 15 and 15. Accordingly, a driving voltage applied from the outside is to be carried to the piezoelectric resonator element 11.

The silicone-based conductive adhesive 15 is used for the following reasons. That is, in the case in which the piezoelectric resonator 10 or the piezoelectric oscillator 20 is subject to conditions of varying temperature, when a conductive adhesive formed of a rigid resin, such as an epoxy-based or a polyimide-based resin, is used instead of the silicone-based conductive adhesive, and when a difference in expansion and contraction is generated between the piezoelectric resonator element 11 and the package base 12, the adhesive formed of the rigid resin described above cannot absorb the difference described above, and stress is applied to the piezoelectric resonator element 11, whereby characteristic degradation, such as a change in frequency, an increase in CI (crystal impedance), and the like may occur in some cases.

In addition, in the case in which the piezoelectric resonator 10 or the piezoelectric oscillator 20 is mounted on a mounting substrate or the like, when a deforming effect caused by an external force is applied thereto and is transferred to the piezoelectric resonator element 11 via the adhesive, the same phenomenon as described above may occur.

Accordingly, as described above, the electrodes of the piezoelectric resonator element 11 are bonded to the mounting electrodes 14 and 14 using relatively soft silicone-based conductive adhesives 15 and 15. The reason for this is that the silicone-based conductive adhesive is relatively soft and has a buffer effect which does not directly transfer vibration from the exterior to the piezoelectric resonator element 11. In addition, since a silver filler is contained in the silicone-based conductive adhesive, the electrical conductance can be obtained.

However, the silicone-based conductive adhesive 15 has a problem in that the adhesive strength thereof adhered to a gold component in the mounting electrode is low.

That is, gold is an inert metal and is unlikely to be oxidized, and it has an insufficient bonding force to a resin used for an adhesive. In addition to that, since the shrinkage of the silicone-based conductive adhesive is low when cured by heating (ST3 in FIG. 9), the silver filler component contained therein has a weak force penetrating into the surface of the gold of the mounting electrode 14, and hence, an electrical conduction defect may occur in some cases. Furthermore, the silicone-based conductive adhesive 15 may form a resinous layer at the interface with the gold, and as a result, an electrical conduction defect may also occur in some cases.

SUMMARY OF THE INVENTION

An object of the present invention is to provide a piezoelectric device having a structure which can solve the problems described above, which resists impact from the exterior and stress applied to the piezoelectric resonator element, and which can enhance the conduction between the electrode side of the package base and the piezoelectric resonator element.

According to the invention, the object described above can be achieved by a piezoelectric device having a structure in which a piezoelectric resonator element is bonded to electrodes provided on a package base. The piezoelectric device includes underlying exposed electrodes as mounting electrodes, which are provided on the package base and on which the piezoelectric resonator element is mounted; and gold-plated electrodes, which are formed on the package base and to which a driving voltage is carried via conduction paths. The underlying exposed electrodes and the gold-plated electrodes are connected to each other via conductive adhesives, and the piezoelectric resonator element is bonded to the underlying exposed electrodes with silicone-based conductive adhesives provided therebetween.

According to this structure, since the electrodes, to which the piezoelectric resonator element is to be bonded, are formed separately from electrodes that carry a driving voltage, the electrodes are not gold plated when gold plating is performed on the electrodes that carry the driving voltage via conduction paths, whereby the electrodes are formed as the underlying exposed electrodes having only the underlying layer exposed.

In addition, since the piezoelectric resonator element is bonded to the underlying exposed electrodes with silicone-based conductive adhesives provided therebetween, the silicone-based conductive adhesives are not adhered to conventional gold surfaces having poor adhesion, and instead are adhered to the underlying exposed electrodes having irregularities. In the case described above, since the silicone resins penetrate into fine irregularities of the underlying exposed electrodes, the adhesive strengths are enhanced, and in addition, since a silver filler contained in the resin penetrates into the irregularities of the underlying exposed layers, the electrical conductance is also enhanced.

In addition, during the manufacturing process, after plating is performed on the electrodes connected to the conduction paths, when the underlying exposed electrodes and the gold-plated electrodes connected to the conduction paths are connected to each other with the conductive adhesives provided therebetween, a driving voltage can be applied to the piezoelectric resonator element bonded to the mounting electrodes via the conduction paths.

According to another aspect of the invention, the conductive adhesives connecting the underlying exposed electrodes and the gold-plated electrodes are conductive adhesives including a rigid resin.

According to this structure, since the underlying exposed electrodes and the gold-plated electrodes are connected by the conductive adhesives including a rigid resin, such as an epoxy-base or a polyimide-based adhesive, a mechanical strength of the connection can be enhanced.

According to another aspect of the invention, the underlying exposed electrodes are metalized electrodes.

According to another aspect of the invention, the underlying exposed electrodes are tungsten metalized electrodes.

In addition, according to another aspect of the invention, the object described above can be achieved by a method for manufacturing a piezoelectric device having a structure in which a piezoelectric resonator element is bonded to electrodes provided on a package base. The method for manufacturing the piezoelectric device includes: laminating a plurality of ceramic materials so as to form an internal space; forming conduction paths which are formed of a conductive metal and which pass through the layers; forming electrodes exposed to the internal space; forming mounting electrodes which are separated from the electrodes and to which the piezoelectric resonator element is bonded; after the laminated ceramic materials are fired, performing gold plating on the electrodes exposed to the internal space by using the conduction paths while having the mounting electrodes as underlying exposed electrodes whose conductive metals remain exposed; connecting the underlying exposed electrodes and the gold-plated electrodes with conductive adhesives provided therebetween; and bonding the piezoelectric resonator element to the underlying exposed electrodes with silicone-based conductive adhesives provided therebetween.

According to this method, since the mounting electrodes and the electrodes connected to the conduction paths are formed separately, and after the materials for the package base are fired, gold plating is performed using the conduction paths, whereby the mounting electrodes are not gold plated, and the underlying exposed electrodes are formed having only the underlying layer exposed.

Subsequently, when the underlying exposed electrodes and the electrodes connected to the conduction paths are simply connected to each other, a structure can be obtained in which a driving voltage is applied to the piezoelectric resonator element bonded to the mounting electrodes via the conduction paths.

In the case described above, since the piezoelectric resonator element is bonded to the underlying exposed electrodes with the silicone-based conductive adhesives provided therebetween, the silicone-based conductive adhesives are not adhered to conventional gold surfaces having poor adhesion but are adhered to the underlying exposed electrodes having irregularities. In this case, since the silicone-based conductive adhesives penetrate into fine irregularities of the underlying exposed electrodes, the adhesive strength is enhanced, and in addition, since a silver filler contained therein penetrates into the fine irregularities of the underlying exposed electrodes, the electrical conductance is also enhanced.

Furthermore, according to another aspect of the invention, the object described above can be achieved by a method for manufacturing a piezoelectric device having a structure in which a piezoelectric resonator element is bonded to electrodes provided on a package base. The method for manufacturing the piezoelectric device includes: laminating a plurality of ceramic materials so as to form an internal space; forming conduction paths which are formed of a conductive metal and which pass through the layers; forming electrodes exposed to the internal space; forming mounting electrodes which are separated from the electrodes and to which the piezoelectric resonator element is bonded; after the laminated ceramic materials are fired, performing gold plating on the electrodes exposed to the internal space by using the conduction paths while having mounting electrodes as underlying exposed electrodes whose conductive metals remain exposed; after an integrated circuit is mounted in the internal space, bonding the piezoelectric resonator element to the underlying exposed electrodes with silicone-based conductive adhesives provided therebetween; and subsequently connecting the underlying exposed electrodes and the gold-plated electrodes to each other with conductive adhesives provided therebetween.

According to this method, among piezoelectric devices, the piezoelectric oscillator having an integrated circuit in the package base is formed by the steps of, after the mounting electrodes and the electrodes connected to the conduction paths are formed by steps approximately equivalent to those of the previously described method, and after the integrated circuit is mounted in the internal space, bonding the piezoelectric resonator element to the underlying exposed electrodes with the silicone-based conductive adhesives provided therebetween, and subsequently connecting the underlying exposed electrodes and the gold-plated electrodes with the conductive adhesives provided therebetween. Accordingly, in addition to the effect described in the previously described method, when there is an extra space in the package base, oscillation characteristics or the like of the piezoelectric resonator element itself can be tested when bonded to the package base.

BRIEF DESCRIPTION OF THE DRAWINGS

FIGS. 1(a) and 1(b) show a piezoelectric resonator according to a preferable embodiment of the present invention, in which FIG. 1(a) is a plan view showing the interior of the piezoelectric resonator by removing a lid body thereof, and FIG. 1(b) is a schematic cross-sectional view showing the interior taken along plane E—E (shown in FIG. 1(a)) by removing the lid body;

FIGS. 4(a) and 4(b) show a package base formed of laminated base materials for the piezoelectric resonator shown in FIGS. 1(a) and 1(b), in which FIG. 4(a) is a plan view of the package base, and FIG. 4(b) is a schematic cross-sectional view taken along plane line F–F (shown in FIG. 4(a));

FIGS. 5(a)–5(c) show an embodiment of a piezoelectric oscillator to which the present invention is applied, in which FIG. 5(a) is a plan view showing the interior of the piezoelectric oscillator by removing a lid body thereof, FIG. 5(b) is an expanded view showing a mount structure of a piezoelectric resonator element placed in the piezoelectric oscillator, and FIG. 5(c) is a schematic cross-sectional view showing the interior taken along plane G—G (shown in FIG. 5(a)) by removing the lid body;

FIGS. 7(a) and 7(b) show an arrangement of the individual electrodes by showing a package base formed of laminated individual base materials for the piezoelectric oscillator shown in FIGS. 5(a)–5(c), in which FIG. 7(a) is a plan view of the package base, and FIG. 7(b) is a schematic cross-sectional view taken along plane H—H (shown in FIG. 7(a));

FIGS. 8(a) and 8(b) show a conventional piezoelectric resonator, in which FIG. 8(a) is a plan view showing the interior of the piezoelectric resonator by removing a lid body thereof, and FIG. 8(b) is a schematic cross-sectional view showing the interior taken along plane A–A (shown in FIG. 8(a)) by removing the lid body;

FIGS. 11(a) and 11(b) show a package base formed of laminated individual base materials for the piezoelectric resonator shown in FIGS. 8(a) and 8(b), in which FIG. 11(a) is a plan view of the package base, and FIG. 11(b) is a schematic cross-sectional view taken along plane B—B (shown in FIG. 11(a));

FIGS. 12(a) and 12(b) show a conventional piezoelectric oscillator, in which FIG. 12(a) is a plan view showing the interior of the piezoelectric oscillator by removing a lid body thereof, and FIG. 12(b) is a schematic cross-sectional view taken along plane C—C (shown in FIG. 12(a)) by removing the lid body;

FIGS. 13(a) and 13(b) show a package base formed of laminated individual base materials for the piezoelectric oscillator shown in FIGS. 12(a) and 12(b), in which FIG. 13(a) is a plan view of the package base, and FIG. 13(b) is a schematic cross-sectional view taken along plane D—D (shown in FIG. 13(a)).

DETAILED DESCRIPTION OF PREFERRED EMBODIMENTS

Hereinafter, preferred embodiments of the present invention will be described with reference to drawings.

First Embodiment

Figure 1A:
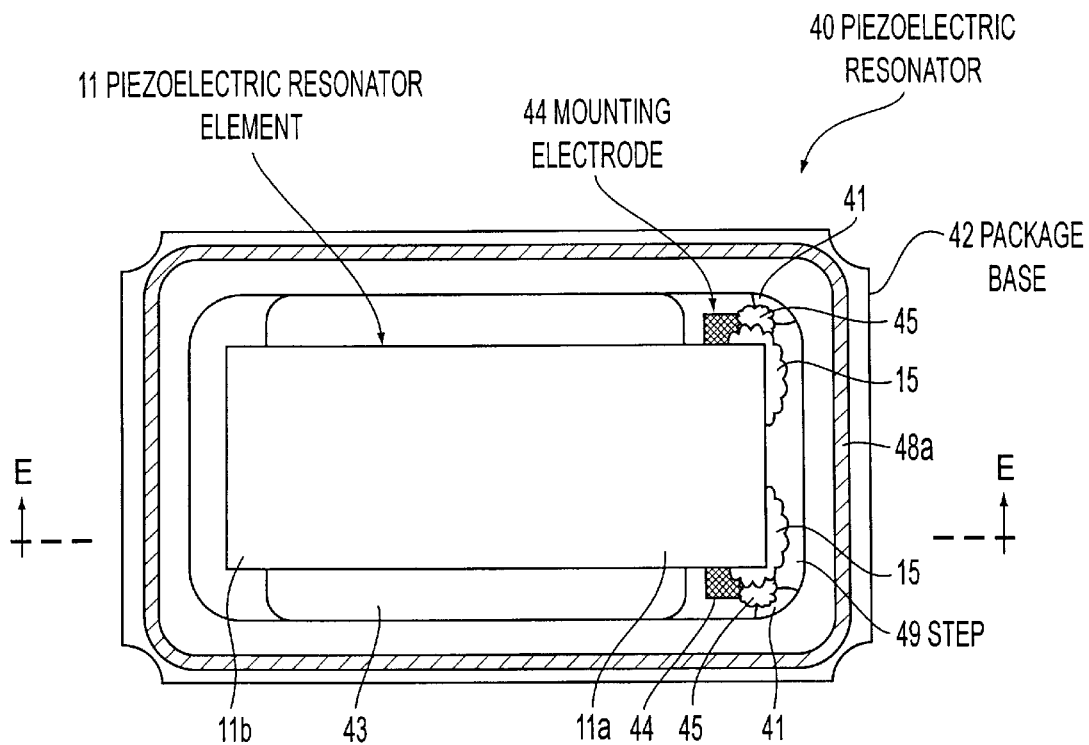

FIGS. 1(a) and (b) show a piezoelectric resonator as an example of a piezoelectric device to which the present invention is applied.

Figure 1B:
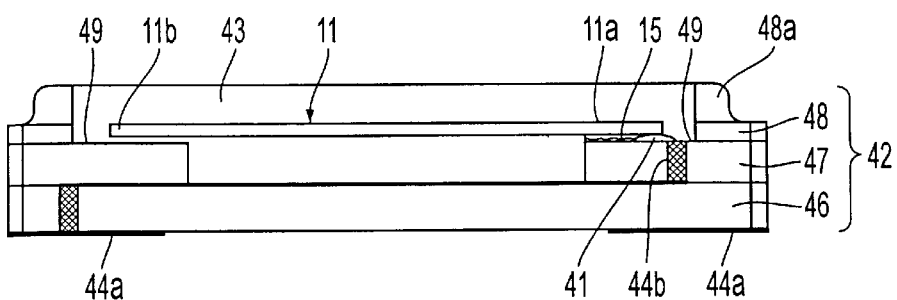

In FIGS. 1(a) and (b), for the convenience of understanding, a lid body thereof is omitted. FIG. 1(a) is a plan view showing the interior of the piezoelectric resonator by removing the lid body, and FIG. 1(b) is a schematic cross-sectional view showing the interior taken along plane E—E (shown in FIG. 1(a)) by removing the lid body.

In FIGS. 1(a) and (b), a piezoelectric resonator 40 has a package base 42 in the form of a box in which a space portion 43 is formed for accommodating a piezoelectric resonator element 11 in the form of a plate. One end 11a of the piezoelectric resonator element 11 is fixed on two mounting electrodes 44 and 44, disposed on a step 49 formed in the space portion 43, by bonding using silicone-based conductive adhesives 15 and 15, and the other end 11b is a free end.

In this structure, the piezoelectric resonator element 11 is formed of, for example, quartz crystal, and on the surface thereof, electrodes (not shown) are formed, which apply a driving voltage to the quartz crystal that performs predetermined oscillation. As a material for the lid body, which is not shown in FIGS. 1(a) and (b), seals the package base 42, a metal, such as Koval, or a ceramic, such as alumina, is used.

As a material for the package base 42, a ceramic, such as alumina, is used, and in the case shown in FIGS. 1(a) and (b), on a first base material 46 in the form of a flat plate, a second base material 47, having an opening formed therein, is placed, and in addition, a third base material 48 having an opening formed therein, which is larger than the opening in the second base material, is placed thereon. Furthermore, on the third base material 48, a seam ring 48a is disposed.

Accordingly, the package base 42 has the space portion 43 formed therein so that the piezoelectric resonator element 11 is to be accommodated, and in addition, the step 49 is formed for bonding the piezoelectric resonator element 11 thereto.

Unlike typical electrode structures, the mounting electrodes 44 and 44 on the step 49 have structures in which underlying layers thereof are only exposed. That is, in this embodiment, the mounting electrodes 44 and 44 are formed of, for example, tungsten metalized layers. In the vicinity of the individual mounting electrodes 44 and 44, gold-plated electrodes 41 and 41 exposing gold on the surfaces thereof are formed, the individual gold-plated electrodes 41 and 41 are connected to conduction paths 44b passing through the laminated structure formed of laminated base materials, respectively, and are connected to external terminals 44a exposed to the exterior of the package base 42. In addition, the mounting electrodes 44 and 44 and the gold-plated electrodes 41 and 41 are connected to each other by conductive adhesives 45 and 45 formed of a rigid resin. In this embodiment, as the conductive adhesives 45 and 45, for example, an epoxy-based or a polyimide-based resin, containing a silver filler as a conductive material that imparts conductance, is preferably used. Accordingly, a driving voltage applied from the external terminals 44a is carried to the gold-plated electrodes 41 and 41 via the conduction paths 44b, and since the gold-plated electrodes 41 and 41 and the mounting electrodes 44 and 44 are connected to each other by the conductive adhesives 45 and 45, the driving voltage from the gold-plated electrodes 41 and 41 is applied to the piezoelectric resonator element 11 via the mounting electrodes 44 and 44. As a result, the piezoelectric resonator element 11 oscillates at a predetermined frequency.

Figure 2:
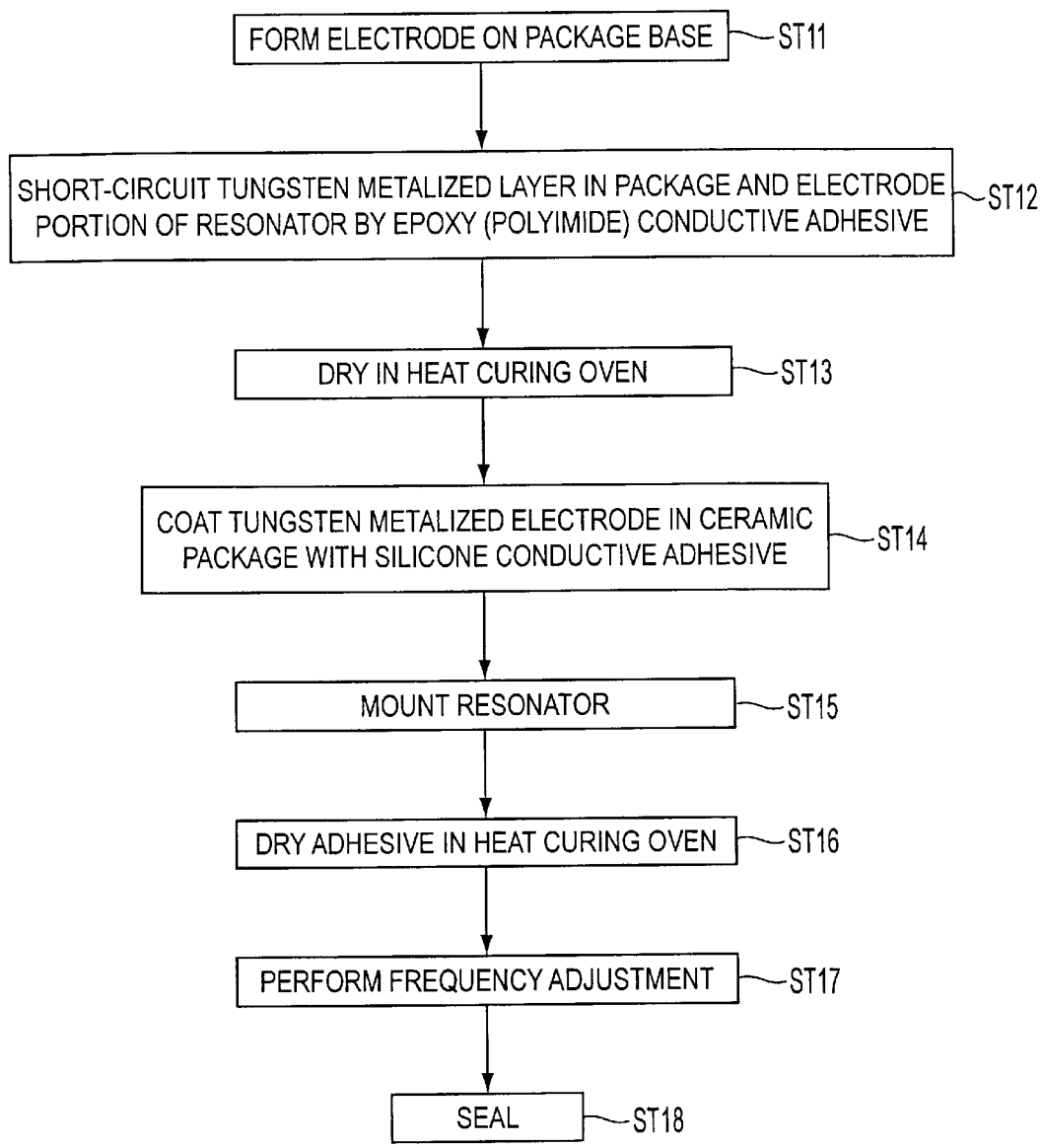
FIG. 2 is a flow chart generally showing manufacturing steps of the piezoelectric resonator shown in FIGS. 1(a) and 1(b)

FIG. 2 is a flow chart generally showing steps of manufacturing the piezoelectric resonator 40 described above.

In FIG. 2, first, the package base 42 is formed using a ceramic material, such as alumina, and the mounting electrodes 44 and 44 and the like are formed at positions corresponding to the piezoelectric resonator element 11 (ST11).

In the step described above, since the package base 42 is formed to have a laminated structure as described above, green sheets composed of piezoelectric materials corresponding to individual layers are formed, respectively, are laminated to each other, and are then fired.

Figure 3:
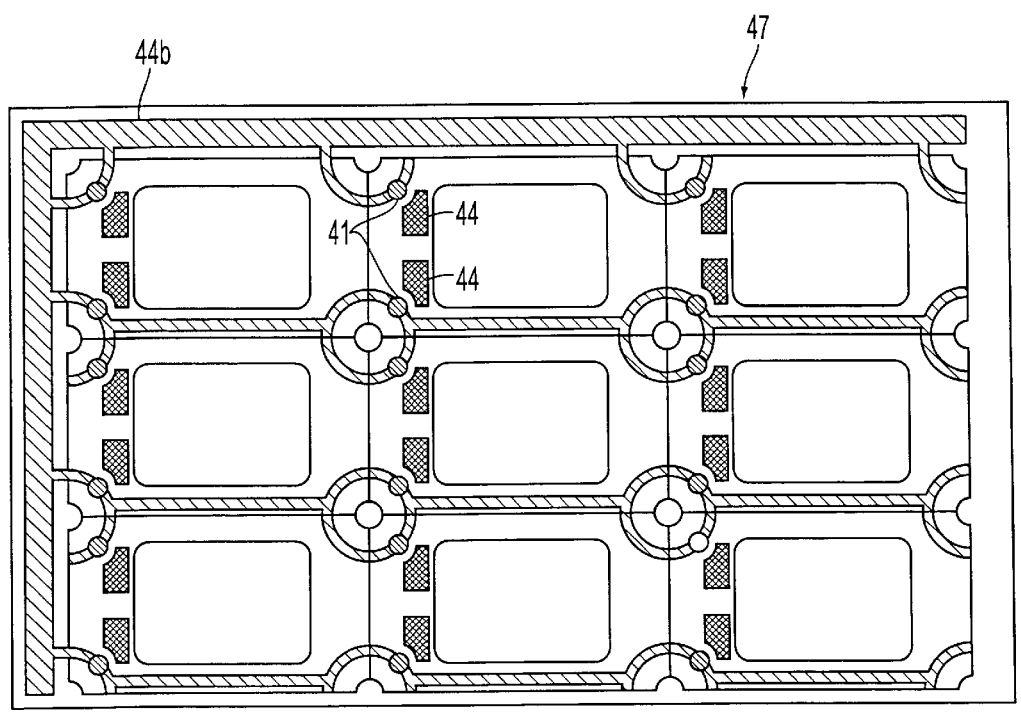
FIG. 3 is a plan view showing a green sheet including second base material layers for the piezoelectric resonator shown in FIGS. 1(a) and 1(b)

For example, in FIG. 3, a green sheet including the second base material layers 47 is shown, and a state is shown in which a plurality of second green base materials 47 are formed in one green sheet which is not cut yet. On the second base material layer 47, as shown in FIG. 3, the mounting electrodes 44 and 44 are provided at positions corresponding to the place on which the piezoelectric resonator element 11 is to be mounted. In addition, the mounting electrodes 44 and 44 are formed so as to be electrically separated from the conduction paths 44b.

In addition, for example, at the positions in the vicinity of the mounting electrodes 44 and 44, as shown in FIG. 3, the circular gold-plated electrodes 41 and 41 are integrally formed with the corresponding conduction paths 44b and 44b.

Accordingly, since the conduction path 44b, the gold-plated electrode 41, and the external terminal 44a are integrally formed, they are electrically connected to each other, and the surfaces thereof can be simultaneously gold plated (Au) by electroplating; however, the mounting electrodes 44 and 44, which are separated therefrom and which are provided with the tungsten metalized films, are not gold plated by this plating operation, and the underlying layers thereof remain exposed.

Figure 4A:
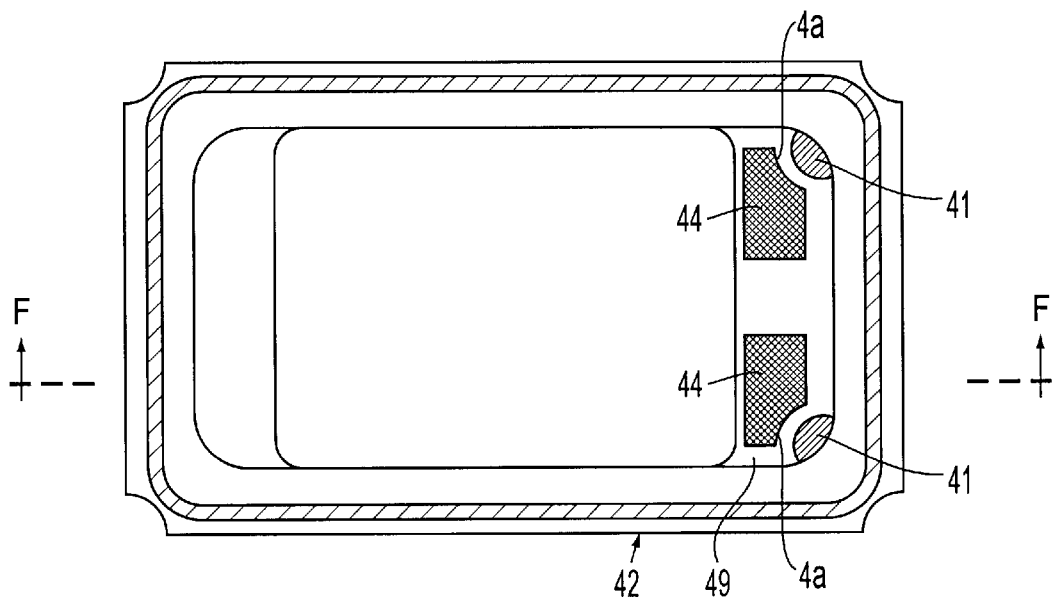
Figure 4B:
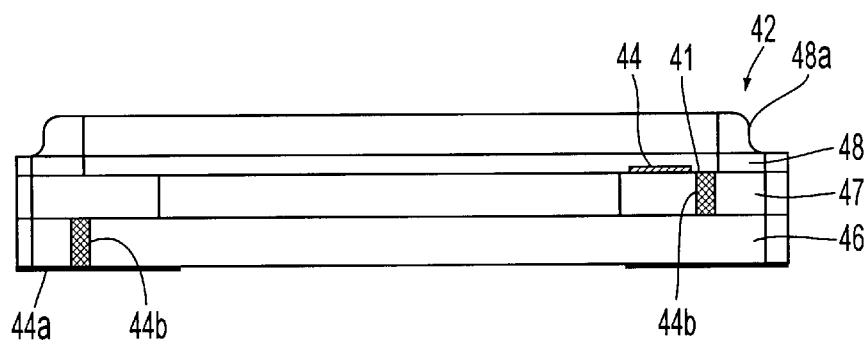

That is, FIGS. 4(a) and 4(b) show the package base 42 formed of the laminated individual base materials, FIG. 4(a) is a plan view of the package base 42, and FIG. 4(b) is a schematic cross-sectional view taken along plane F—F (shown in FIG. 4(a)).

As shown in FIGS. 4(a) and 4(b), when the third base material 48 is placed on the second base material 47, the two mounting electrodes 44 and 44 are exposed on the step 49.

At the corners of the mounting electrodes 44 and 44, cutaway portions 4a and 4a are formed, as shown in FIG. 4(a). Outside the cutaway portions 4a and 4a, the gold-plated electrodes 41 and 41 are exposed, and the mounting electrodes 44 and 44 and the gold-plated electrodes 41 and 41 are electrically separated from each other.

Accordingly, between the mounting electrodes 44 and 44 and the gold-plated electrodes 41 and 41, as shown in FIGS. 1(a) and 1(b), the conductive adhesives 45 and 45 formed of a rigid resin are applied (ST12), respectively, and are then dried and cured in a heat curing oven (ST13).

As a result, the mounting electrodes 44 and 44 and the gold-plated electrodes 41 and 41 are electrically connected to each other. In the case described above, since the epoxy-based or the polyimide-based resin has a superior adhesive strength, not only to the tungsten metalized surfaces of the mounting electrodes 44 and 44, but also to the gold surfaces of the gold-plated electrodes 41 and 41, and is rigid, the electrical connection between the mounting electrodes 44 and 44 and the gold-plated electrodes 41 and 41 can be reliably performed.

Next, the mounting electrodes 44 and 44 of the package base 42 shown in FIGS. 4(a) and 4(b) are coated with the silicone-based conductive adhesives 15 and 15, respectively (ST14).

Next, on the mounting electrodes 44 and 44 coated with the silicone-based conductive adhesives 15 and 15, the piezoelectric resonator element 11 is mounted (ST15), then the package base 42 is placed in a heat curing oven, which is not shown, and then the silicone-based conductive adhesives 15 and 15 are dried and cured (ST16), whereby fixing by bonding is performed.

Subsequently, when the piezoelectric resonator element 11 is sufficiently fixed on the mounting electrodes 44 and 44 with the silicone-based conductive adhesives 15 and 15 provided therebetween, a driving voltage from the external terminals 44a is carried to the mounting electrodes 44 and 44 via the conduction paths 44b and the gold-plated electrodes 41 and 41, the driving voltage is then applied to the piezoelectric resonator element 11 from the mounting electrodes 44 and 44, and while the oscillation frequency is monitored, the weights of the electrodes are reduced by, for example, irradiating laser light on the surface of the piezoelectric resonator element 11, whereby frequency adjustment is performed (ST17).

Next, the lid body, which is not shown, is placed on the package base 42, and sealing is performed by, for example, seam welding (ST18).

As described above, the piezoelectric resonator 40 is complete.

Since the first embodiment is thus constructed, and the piezoelectric resonator element 11 is bonded to the mounting electrodes 44 and 44, which are the underlying exposed electrodes having the tungsten metalized layers exposed, using the silicone-based conductive adhesives 15 and 15 provided therebetween, the adhesion of the silicone-based conductive adhesives 15 and 15 is performed by penetration thereof into the finely irregular surfaces of the mounting electrodes 44 and 44, instead of conventional surfaces formed of gold having poor adhesion. In this case, when the adhesive strength is enhanced by penetration of the silicone resin into the fine irregularities of the mounting electrodes 44 and 44, the silver filler contained in the resin simultaneously penetrates into the fine irregularities of the underlying exposed electrodes, whereby the electrical conductance is also enhanced.

Accordingly, even when a difference in expansion and contraction is generated between the piezoelectric resonator element 11 and the package base 42, the silicone-based conductive adhesives 15 and 15 absorb the difference described above and prevent the piezoelectric resonator element 11 from being stressed, whereby degradation of characteristics, such as a change in frequency, an increase in CI (crystal impedance), or the like can be effectively avoided.

In addition, since the bonding of the piezoelectric resonator element 11 to the mounting electrodes 44 and 44 is performed by using the silicone-based conductive adhesives 15 and 15, and cured silicone-based conductive adhesives 15 and 15 are relatively soft, impact and vibration from the outside are absorbed therein, whereby a structure having superior impact resistance can be formed.

Furthermore, since the gold-plated electrodes 41 and 41 and the mounting electrodes 44 and 44 are connected to each other by using an epoxy-based or a polyimide-based conductive adhesive, the gold-plated electrodes 41 and 41 and the mounting electrodes 44 and 44 can be reliably and electrically connected to each other by the rigid resin. Accordingly, a driving voltage from the external terminals 44a can be reliably carried to the mounting electrodes 44 and 44 via the conduction paths 44b and the gold-plated electrodes 41 and 41 and is reliably applied to the piezoelectric resonator element 11 mounted on the mounting electrodes 44 and 44.

In the case in which the structure described above is formed, since the mounting electrodes 44 and 44 are not directly connected to the gold-plated electrodes 41 and 41, when the gold-plated electrodes 41 and 41 are formed by plating using the conduction paths 44b during the manufacturing, on the surface of the mounting electrodes 44 and 44 which are not directly connected thereto, the tungsten metalized layers remain conveniently without being gold plated.

In the steps shown in FIG. 2, the electrical connection between the mounting electrodes 44 and 44 and the gold-plated electrodes 41 and 41 is first performed (ST12), and the bonding between the mounting electrodes 44 and 44 and the piezoelectric resonator element 11 is then performed (ST15). However, the invention is not limited to that described above, and after the bonding between the mounting electrodes 44 and 44 and the piezoelectric resonator element 11 is performed, the electrical connection between the mounting electrodes 44 and 44 and the gold-plated electrodes 41 and 41 may be performed.

However, the method described above, in which the electrical connection between the mounting electrodes 44 and 44 and the gold-plated electrodes 41 and 41 is first performed (ST12), and the bonding between the mounting electrodes 44 and 44 and the piezoelectric resonator element 11 is then performed (ST15), has an advantage compared to the case, for example, in which the mounting areas of the mounting electrodes 44 and 44 are small, and hence, they may be covered when the silicone-based conductive adhesives are first applied thereto.

Next, a second embodiment of a piezoelectric oscillator to which the present invention is applied will be described.

Most of the features of the manufacturing steps described in the first embodiment are equivalent to those of another device, i.e., the piezoelectric oscillator. That is, unlike the piezoelectric resonator, the piezoelectric oscillator has an integrated circuit mounted in the package base, and accordingly, the structure and the manufacturing steps are slightly different from those of the piezoelectric resonator.

Second Embodiment

Figure 5A:
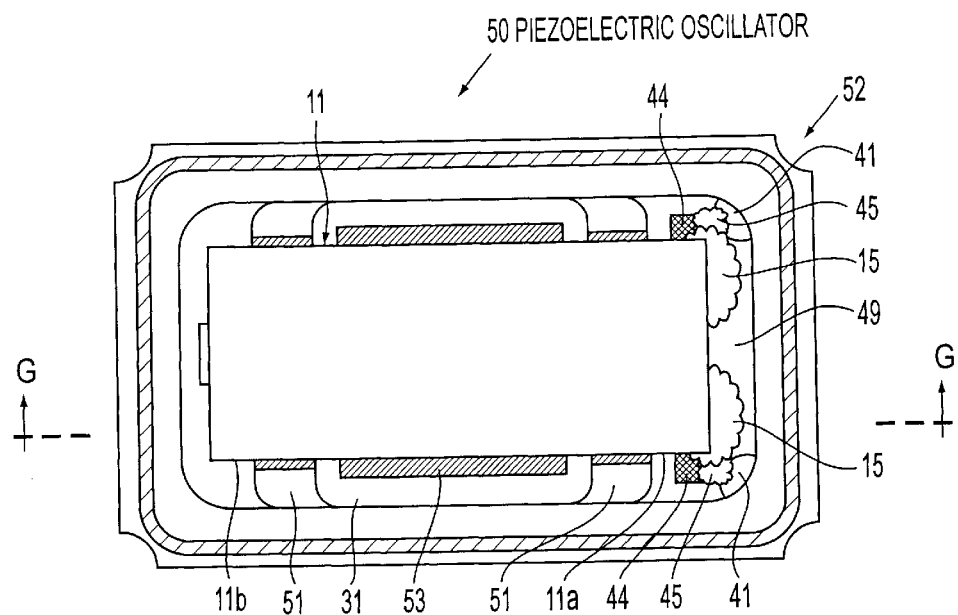
Figure 5B:
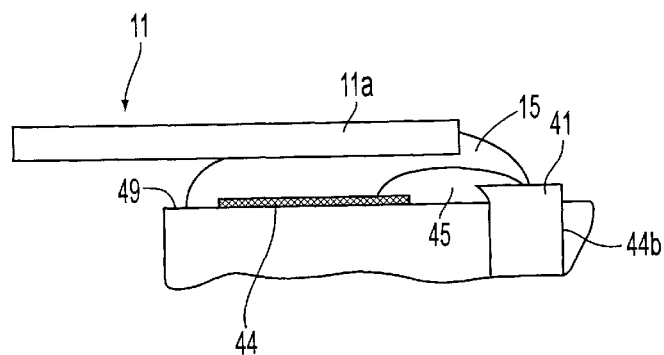
Figure 5C:
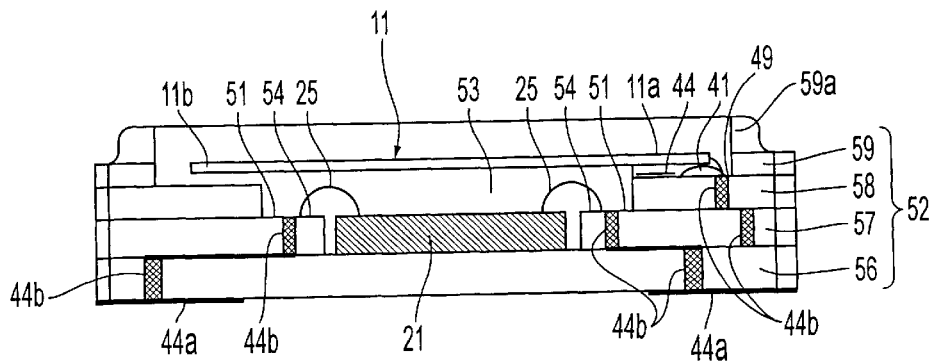

FIGS. 5(a)–5(c) show a piezoelectric oscillator of an embodiment to which the present invention is applied, and for the convenience of understanding, a lid body thereof is omitted. FIG. 5(a) a plan view showing the interior state of the piezoelectric oscillator by removing the lid body, FIG. 5(b) is an expanded view showing a mount structure of a piezoelectric resonator element contained in the piezoelectric oscillator, and FIG. 5(c) is a schematic cross-sectional view showing the interior taken along plane G—G (shown in FIG. 5(a)) by removing the lid body.

Figure 12A:
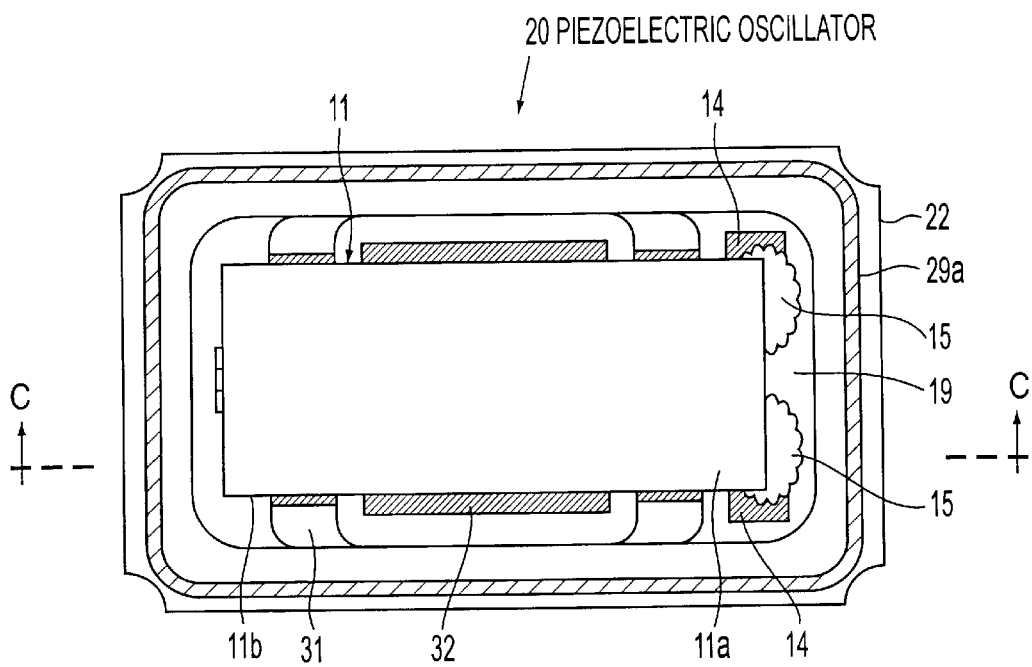
Figure 12B:
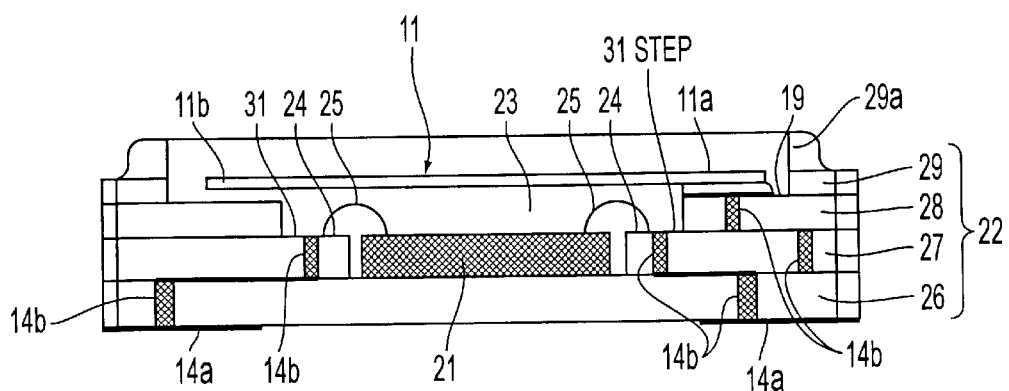
Figure 13A:
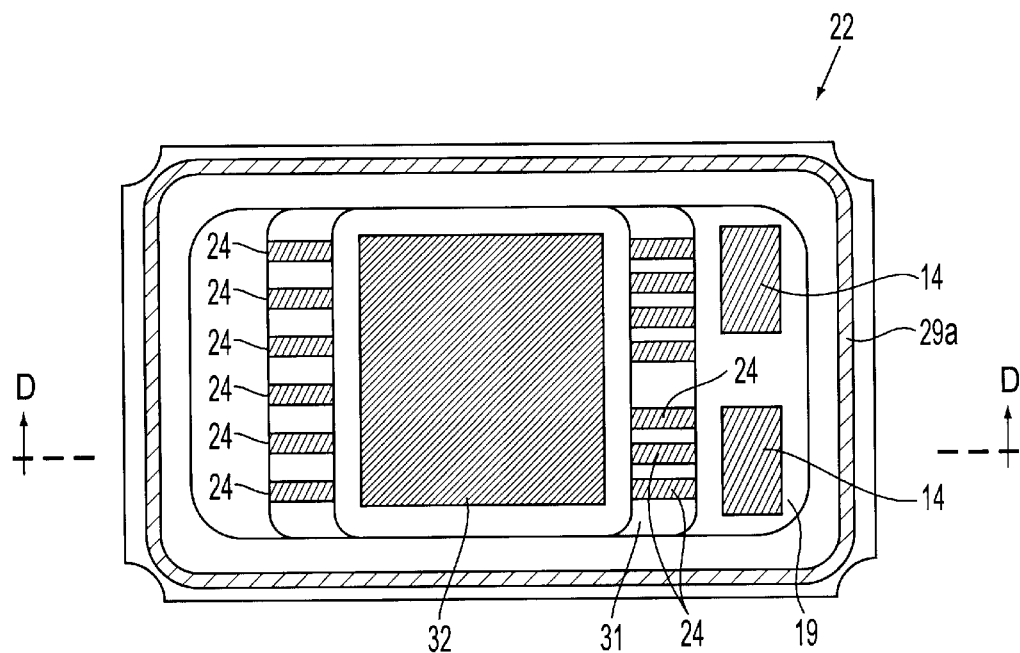
Figure 13B:
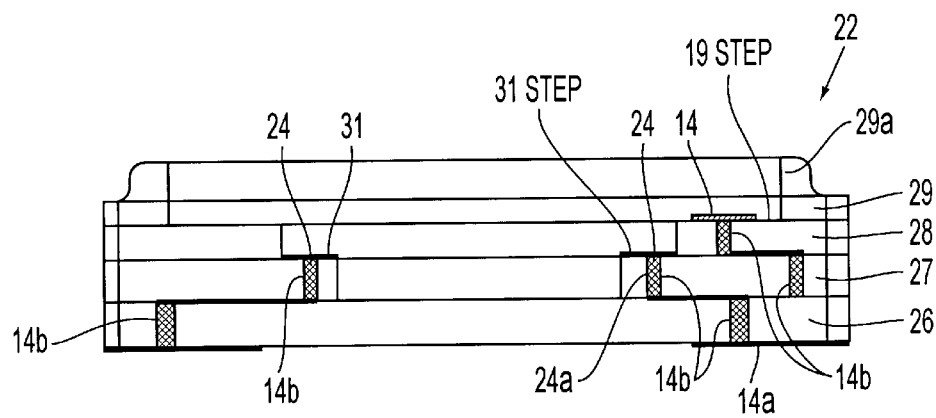

In these figures, the same reference numerals of the constituents of the piezoelectric resonator in the first embodiment and of the piezoelectric oscillator shown in FIG. 12 designate constituents equivalent thereto, descriptions thereof are omitted, and different points will be mainly described.

A piezoelectric resonator 50 has a package base 52 in the form of a box in which a space portion 53 is formed for accommodating a piezoelectric resonator element 11 in the form of a plate. One end 11a of the piezoelectric resonator element 11 is fixed on two mounting electrodes 44 and 44, disposed on a step 49 formed in the space portion 53, by bonding using silicone-based conductive adhesives 15 and 15, and the other end 11b is a free end.

The package base 52 is formed of four base materials 56, 57, 58, and 59 which are laminated to each other, the base material 56 located at the bottom is a flat plate, and the base materials 57, 58, and 59 placed thereon are formed of ring-shaped or frame-shaped materials having inside diameters which are sequentially increased in this order. Accordingly, the space portion 53 is formed in the package base 52 so that the piezoelectric resonator element 11 is accommodated therein, and in addition to the step 49 to which the piezoelectric resonator element 11 is bonded, a second step 51 is provided at an even lower position.

Unlike typical electrode structures, the mounting electrodes 44 and 44, disposed on the step 49, have structures, similar to that in the first embodiment, in which only the underlying layers thereof are exposed. That is, in this embodiment, the mounting electrodes 44 and 44 are formed of tungsten-metalized layers. In the vicinity of the individual mounting electrodes 44 and 44, gold-plated electrodes 41 and 41 exposing gold at the surfaces thereof are formed, and the gold-plated electrodes 41 and 41 are connected to conduction paths 44b passing through the laminated structure formed of the laminated base materials and are connected to electrodes 54 formed on the step 51, respectively.

As shown in FIG. 5(b), the mounting electrodes 44 and 44 and the gold-plated electrodes 41 and 41 are connected to each other by conductive adhesives 45 and 45 formed of a rigid resin. In this embodiment, the conductive adhesives 45 and 45 are equivalent to those described in the first embodiment.

In addition, on the inside bottom portion of the package base 52, an integrated circuit 21 is mounted, and on the step 51, a plurality of electrodes 54 is formed which is to be wire-bonded to the integrated circuit 21 by gold wires 25.

In the piezoelectric oscillator 50, a driving voltage from the integrated circuit 21 is carried to the gold-plated electrodes 41 and 41 via the conduction paths 44b, and since the gold-plated electrodes 41 and 41 and the mounting electrodes 44 and 44 are connected to each other by the conductive adhesives 45 and 45, the driving voltage from the gold-plated electrodes 41 and 41 is applied to the piezoelectric resonator element 11 via the mounting electrodes 44 and 44. As a result, the piezoelectric resonator element 11 is oscillates at a predetermined frequency.

Figure 7A:
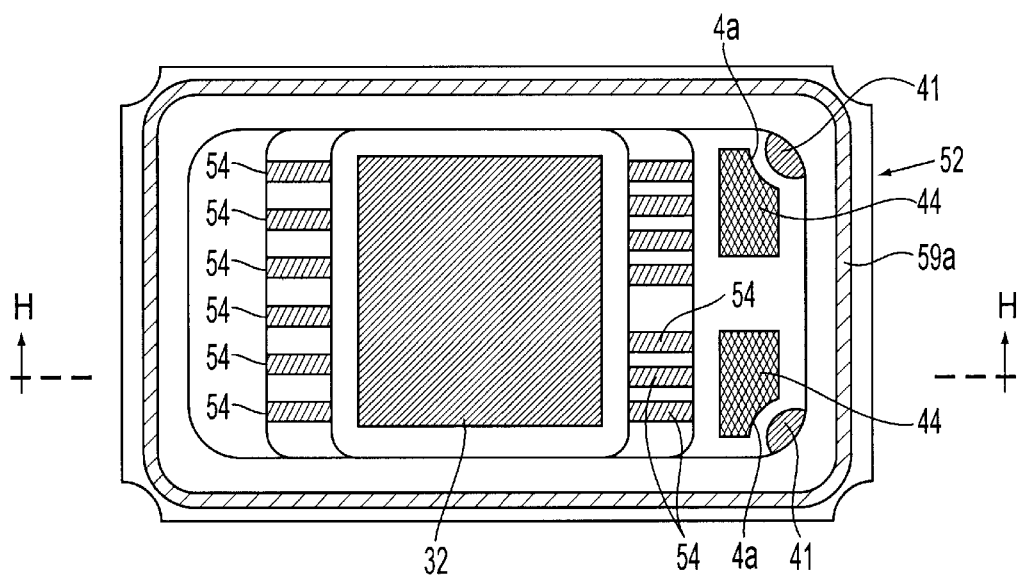
Figure 7B:
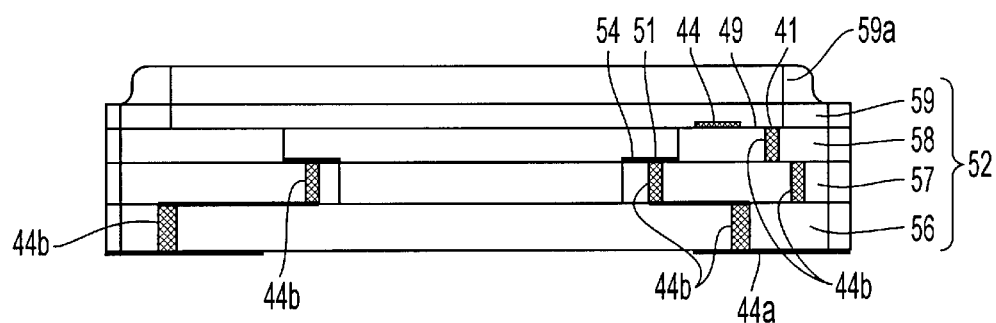
Figure 8A:
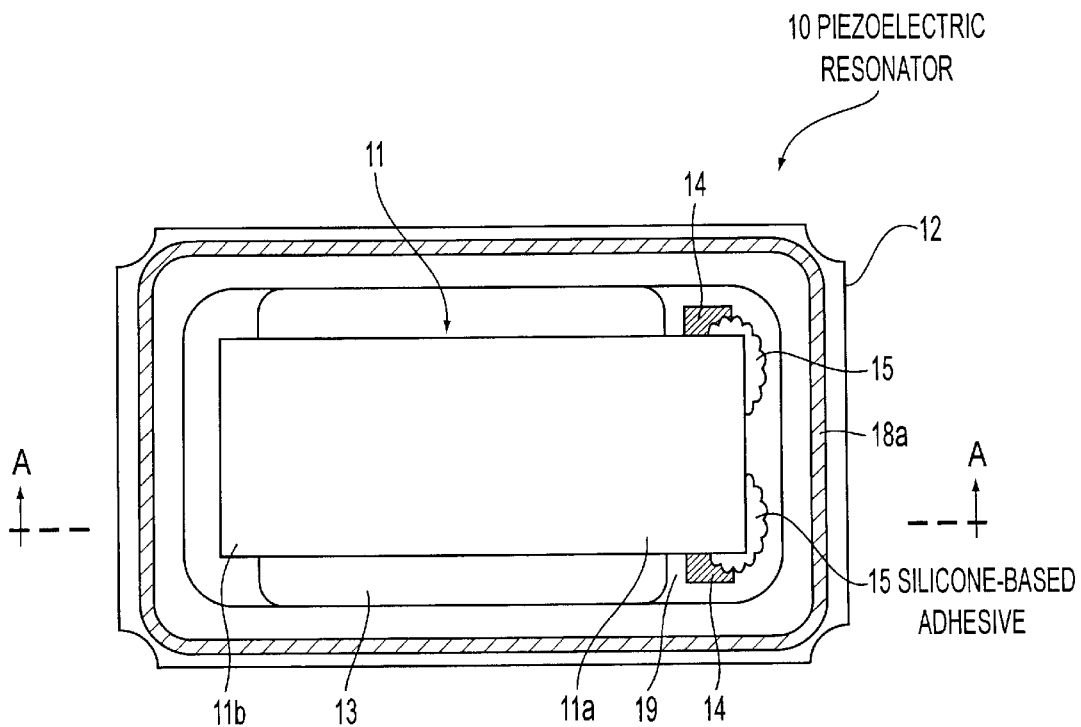
Figure 8B:
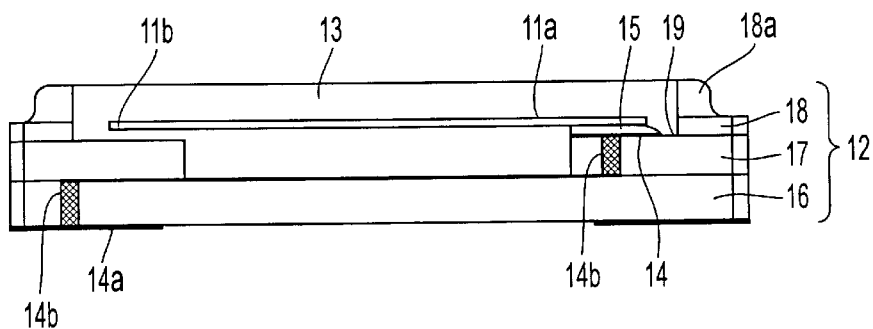
Figure 9:
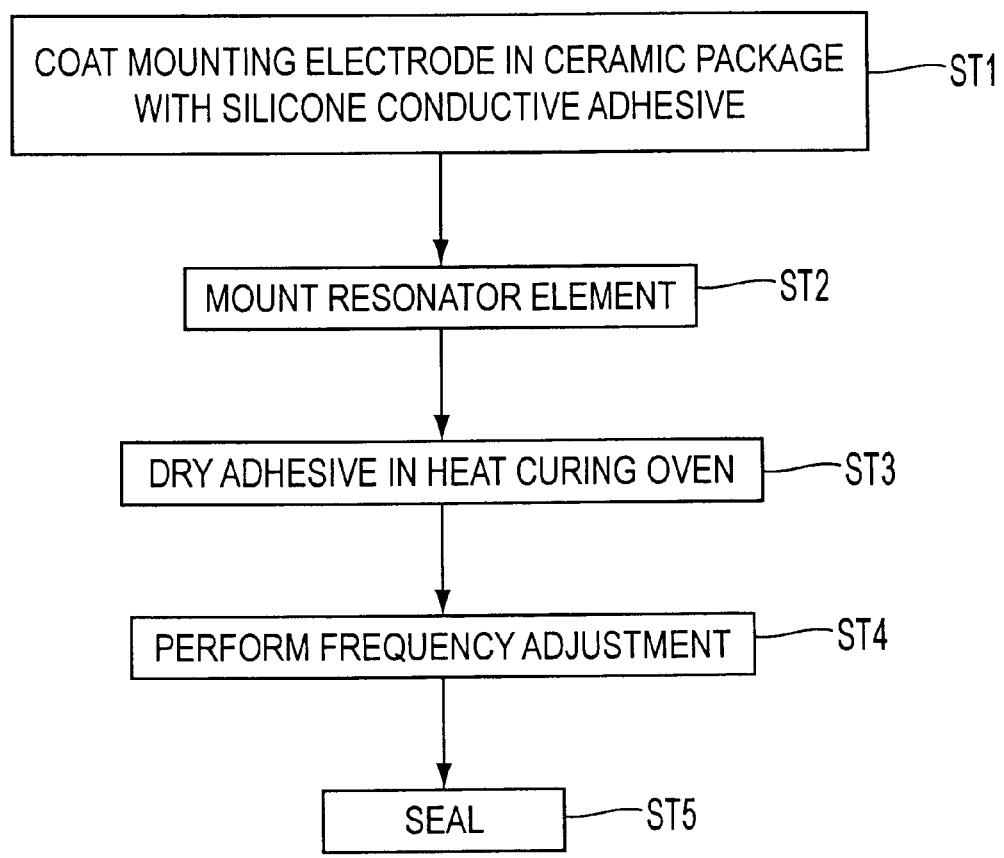
FIG. 9 is a flow chart generally showing manufacturing steps of the piezoelectric resonator shown in FIGS. 8(a) and 8(b)
Figure 10:
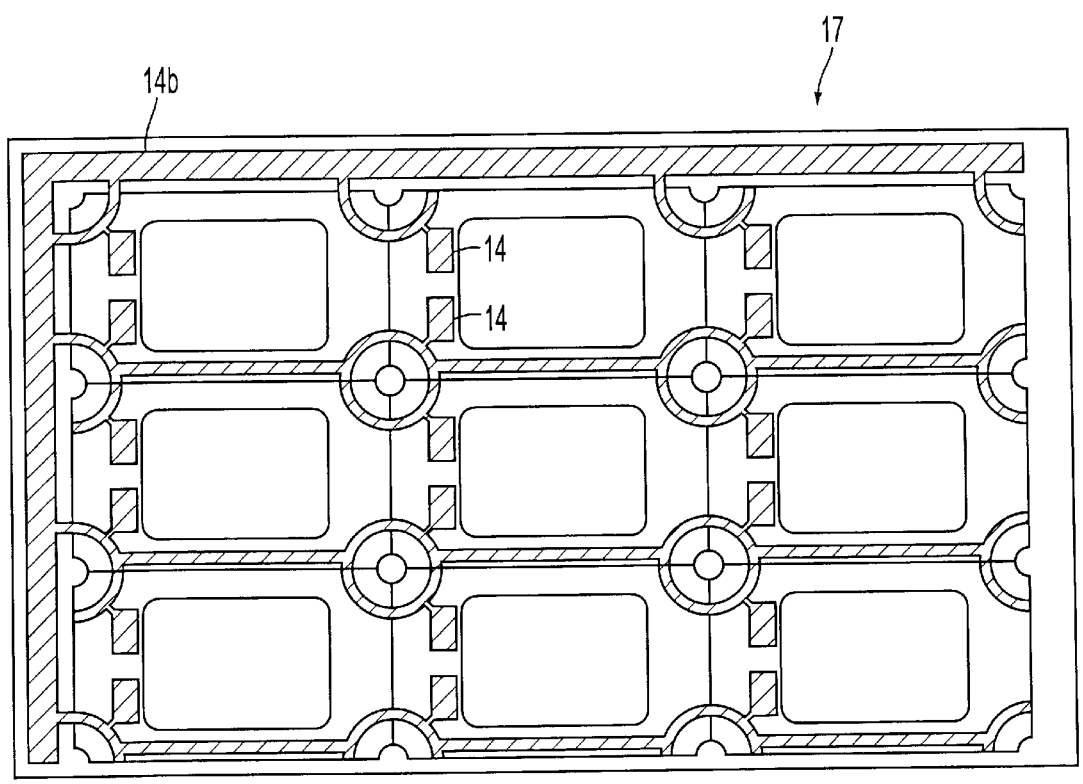
FIG. 10 is a plan view showing a green sheet including second base material layers for the piezoelectric resonator shown in FIGS. 8(a) and 8(b)
Figure 11A:
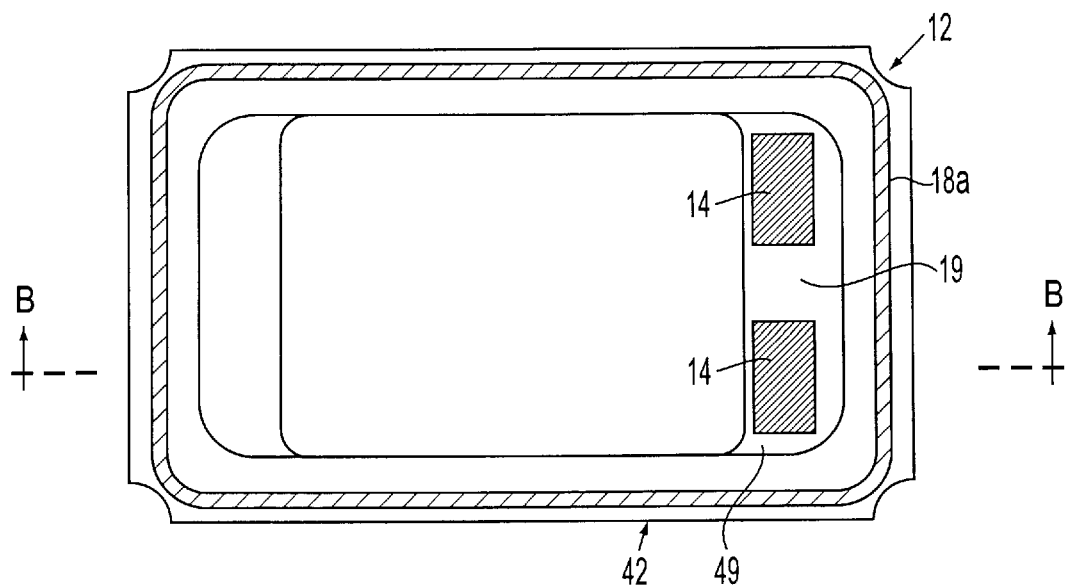
Figure 11B:
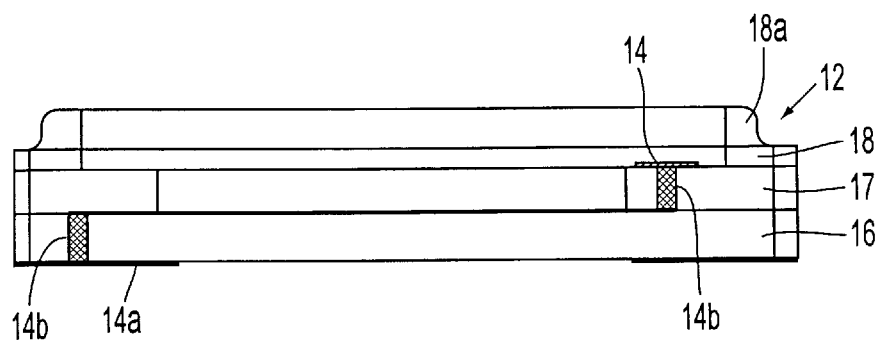

FIGS. 7(a) and 7(b) show the arrangement of the individual electrodes by showing the package base 52 formed of the laminated base materials, FIG. 7(a) is a plan view of the package base 52, and FIG. 7(b) is a schematic cross-sectional view taken along plane H—H (shown in FIG. 7(a)).

As shown in FIGS. 7(a) and 7(b), on the step 49, the mounting electrodes 44 and 44 are formed, and on the step 51, the plurality of electrodes 54 which are to be wire-bonded is formed. In addition, on the inside bottom surface, an electrode 32, that mounts the integrated circuit 21, is provided. Methods for forming these electrodes are equivalent to those described for the piezoelectric resonator 40.

Consequently, in the piezoelectric oscillator 50, when a driving voltage applied from the integrated circuit 21 is applied to the electrodes formed on the surface of the piezoelectric resonator element 11 via the mounting electrodes 44 and 44, the piezoelectric resonator element 11 oscillates at a predetermined frequency, and the output signal thereof is inputted to the integrated circuit 21, whereby an external signal having a predetermined frequency can be obtained.

Figure 6:
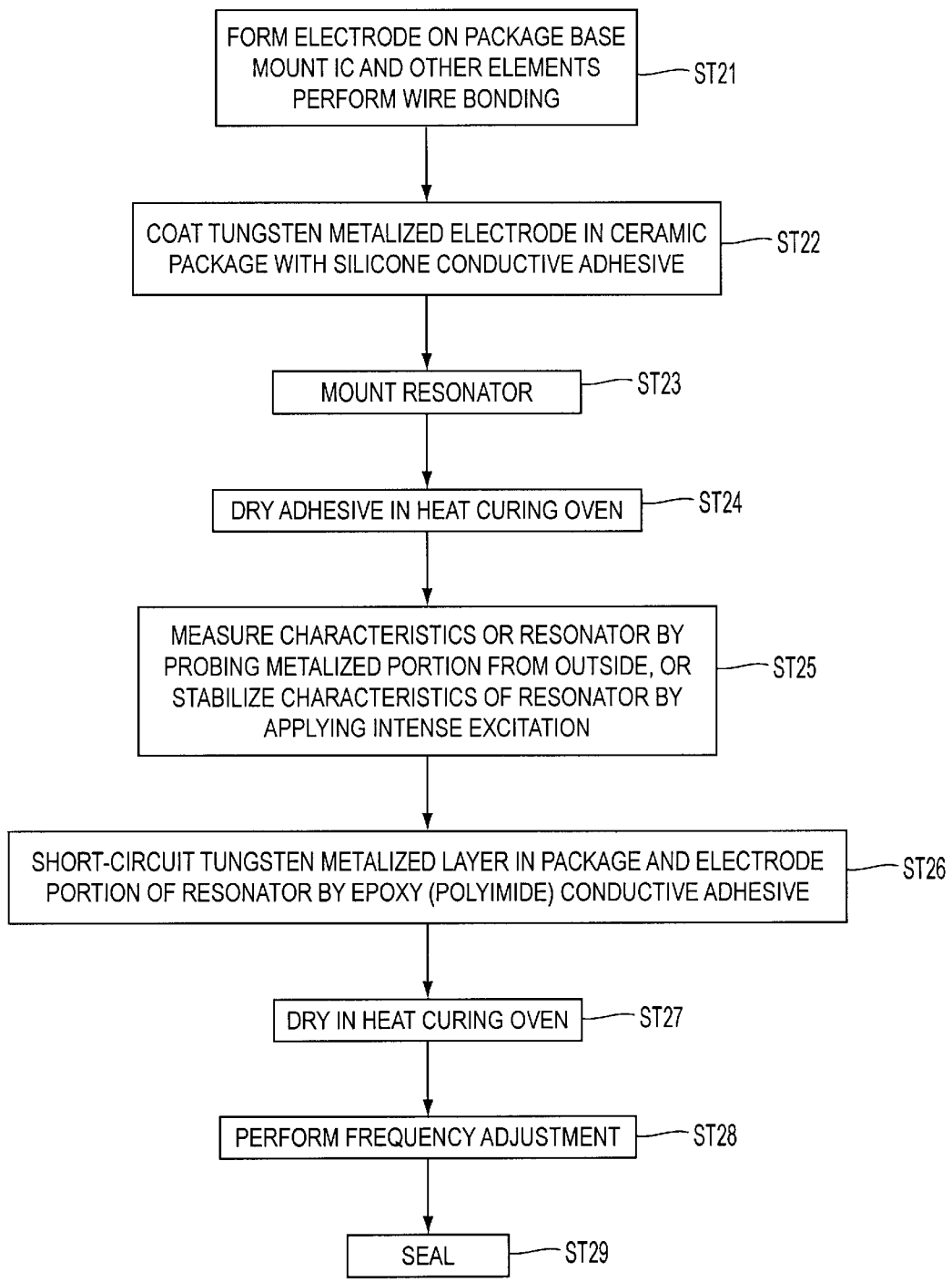
FIG. 6 is a flow chart generally showing manufacturing steps of the piezoelectric oscillator shown in FIGS. 5(a)–5(c)

FIG. 6 is a flow chart generally showing steps of manufacturing the piezoelectric oscillator 50 as described above.

In FIG. 6, first, the package base 52 is formed by using a ceramic material such as alumina, and the mounting electrodes 44 and 44 are formed at positions corresponding to the piezoelectric resonator element 11(ST21).

In the case described above, since the package base 52 has a laminated structure different from that of the first embodiment, base materials 56, 57, 58, and 59, corresponding to the difference described above, are laminated to each other and are fired. The third base material layer 58 is provided at a position corresponding to the place at which the piezoelectric resonator element 11 is to be mounted on the mounting electrodes 44 and 44. In addition, the mounting electrodes 44 and 44 are formed so as to be electrically separated from the conduction paths 44b. Accordingly, at a stage in which the ceramic sheet is not divided, since the conduction paths 44b, electrodes 41 to be gold-plated, the electrodes 54 to be gold plated and to be wire-bonded, and the external terminals 44a are electrically connected to each other, gold (Au) can be simultaneously plated thereon by gold plating; however, to the mounting electrodes 44 and 44, which are separated therefrom and which are provided with tungsten metalized layers, gold is not adhered by this plating operation, and the underlying layers remain exposed.

In addition, as is the case described in FIG. 3, at the corners of the mounting electrodes 44 and 44, cutaway portions 4a and 4a are formed, and outside the cutaway portions 4a and 4a, the gold-plated electrodes 41 and 41 described above are exposed, and the mounting electrodes 44 and 44 and the gold-plated electrodes 41 and 41 are electrically separated from each other (refer to FIG. 7(a)).

Next, the mounting electrodes 44 and 44 of the package base 52 in FIG. 7 are coated with the silicone-based conductive adhesives 15 and 15, respectively (ST22).

Next, on the mounting electrodes 44 and 44 coated with the silicone-based conductive adhesives 15 and 15, the piezoelectric resonator element 11 is mounted (ST23), the package base 52 is placed in a heat curing oven, which is not shown, and the silicone-based conductive adhesives 15 and 15 are dried and cured (ST24), whereby fixing by bonding is performed.

That is, unlike the first embodiment, when the piezoelectric resonator element 11 is bonded to the mounting electrodes 44 and 44 before the mounting electrodes 44 and 44 are electrically connected to the gold-plated electrodes 41 and 41, the advantages described below can be obtained.

In the case in which the piezoelectric oscillator 50 is manufactured, before the gold-plated electrodes 41 and 41 and the mounting electrodes 44 and 44 are connected to each other by the conductive adhesives 45, when there is an extra space in the package base 52, oscillation characteristics of the piezoelectric resonator element 11 itself can be tested at this time.

In particular, by steps of mounting the integrated circuit 21 on the electrode 32 of the package base 52, electrically connecting the electrodes 54 thereto by wire bonding using the gold wires 25, and contacting probes from the outside with the mounting electrodes 44 and 44 so as to apply a driving voltage thereto, the driving voltage is applied to the piezoelectric resonator element 11, and the piezoelectric resonator element oscillates, whereby the oscillation characteristics thereof can be checked (ST25). Depending on the case, even when intense excitation is performed by applying a high driving voltage, since the integrated circuit 21 is not connected, the characteristics and the like in an intense excitation state can be checked without damaging the integrated circuit 21.

Next, between the mounting electrodes 44 and 44 and the gold-plated electrodes 41 and 41, as shown in FIGS. 5(a) –5(c), the conductive adhesives 45 and 45 formed of a rigid resin are applied, respectively (ST26), and drying and curing are performed in a heat curing oven (ST27).

Accordingly, the mounting electrodes 44 and 44 and the gold-plated electrodes 41 and 41 are electrically connected to each other. In the case described above, since the rigid resin, in particular, an epoxy-based or a polyimide-based resin is rigid and has superior adhesive strength not only to the tungsten metalized surfaces of the mounting electrodes 44 and 44, but also to the surfaces of the gold-plated electrodes 41 and 41, the electrical connection between the mounting electrodes 44 and 44 and the gold-plated electrodes 41 and 41 can be reliably established.

In addition, when the piezoelectric resonator element 11 is sufficiently fixed to the mounting electrodes 44 and 44 with the silicone-based conductive adhesives 15 and 15 provided therebetween, a driving voltage from the integrated circuit 21 is carried to the mounting electrodes 44 and 44 via the conduction paths 44b and the gold-plated electrodes 41 and 41, the driving voltage is then applied to the piezoelectric resonator element 11 from the mounting electrodes 44 and 44, and while the oscillation frequency is monitored, the weights of the electrodes are reduced by, for example, irradiating laser light on the surface of the piezoelectric resonator element 11, whereby the frequency adjustment is performed (ST28).

Next, the lid body, which is not shown, is placed on the package base 52, and sealing is performed by, for example, seal welding (ST29).

As described above, the piezoelectric oscillator 50 is complete.

The second embodiment is constructed as described above, the structures of the mounting electrodes 44 and 44 and the gold-plated electrodes 41 and 41 are equivalent to those in the first embodiment, and the bonding structure of the piezoelectric resonator element 11 is equivalent thereto, whereby the same advantages as those of the first embodiment can be obtained.

The present invention is not limited to the embodiments described above.

The present invention can be applied to, in addition to piezoelectric resonators and piezoelectric oscillators, various piezoelectric devices using piezoelectric resonator elements.

In addition, for example, the order of the manufacturing steps can be changed, and furthermore, the conditions and structures described in the embodiments described above may be partly omitted optionally, or they may be combined with each other.

As described above, according to the present invention, a piezoelectric device can be provided having a structure which resists impact from the exterior and which can enhance the electrical conductance between the electrode side of the package base and the piezoelectric resonator element, and a manufacturing method therefor can also be provided.

What is claimed is:

1. A piezoelectric device having a structure in which a piezoelectric resonator element is bonded to electrodes provided on a package base, comprising:

underlying exposed electrodes, which operates as mounting electrodes, and which are provided on the package base and on which the piezoelectric resonator element is mounted; and conductive adhesives;

silicone-based conductive adhesives; and gold-plated electrodes which are formed on the package base and to which a driving voltage is carried via conduction paths, the underlying exposed electrodes and the gold-plated electrodes being connected to each other with the conductive adhesives provided therebetween, and the piezoelectric resonator element being bonded to the underlying exposed electrodes with the silicone-based conductive adhesives provided therebetween.

2. The piezoelectric device according to claim 1, the conductive adhesives connecting the underlying exposed electrodes and the gold-plated electrodes being conductive adhesives including a rigid resin.

3. The piezoelectric device according to claim 1, the underlying exposed electrodes being metalized electrodes.

4. The piezoelectric device according to claim 3, the underlying exposed electrodes being tungsten-metalized electrodes.

5. A method for manufacturing a piezoelectric device having a structure in which a piezoelectric resonator element is bonded to electrodes provided on a package base, the method for manufacturing the piezoelectric resonator element comprising:

laminating a plurality of ceramic materials so as to form an internal space;

forming conduction paths, which are formed of a conductive metal, and which pass through the layers;

forming electrodes exposed to the internal space;

forming mounting electrodes which are separated from the electrodes and to which the piezoelectric resonator element is bonded;

performing, after the laminated ceramic materials are fired, gold plating on the electrodes exposed to the internal space by using the conduction paths while conductive metals of the mounting electrodes remain exposed so as to be used as underlying exposed electrodes;

connecting the underlying exposed electrodes and the gold-plated electrodes to each other with conductive adhesives provided therebetween; and bonding the piezoelectric resonator element to the underlying exposed electrodes with silicone-based conductive adhesives provided therebetween.

6. A method for manufacturing a piezoelectric device having a structure in which a piezoelectric resonator element is bonded to electrodes provided on a package base, the method for manufacturing the piezoelectric resonator element comprising:

laminating a plurality of ceramic materials so as to form an internal space;

forming conduction paths, which are formed of a conductive metal, and which pass between the layers;

forming electrodes exposed to the internal space;

forming mounting electrodes which are separated from the electrodes and to which the piezoelectric resonator element is bonded;

performing, after the laminated ceramic materials are fired, gold plating on the electrodes exposed to the internal space by using the conduction paths while conductive metals of the mounting electrodes remain exposed so as to be used underlying exposed electrodes;

bonding, after an integrated circuit is mounted in the internal space, the piezoelectric resonator element to the underlying exposed electrodes to each other with silicone-based conductive adhesives provided therebetween; and subsequently connecting the underlying exposed electrodes and the gold-plated electrodes with conductive adhesives provided therebetween.

* * * * *